US012638509B2

(12) United States Patent
Qin et al.

(10) Patent No.: US 12,638,509 B2
(45) Date of Patent: May 26, 2026

(54) METHOD FOR ESTIMATING THE TEMPERATURE RISE RATE OF A BATTERY UNDER PULSED HEATING

(71) Applicant: SHELL OIL COMPANY, Houston, TX (US)

(72) Inventors: Yudi Qin, Beijing (CN); Languang Lu, Beijing (CN); Xuebing Han, Beijing (CN); Minggao Ouyang, Beijing (CN); Jianqiu Li, Beijing (CN)

(73) Assignee: SHELL USA, INC., Houston, TX (US)

( * ) Notice: Subject to any disclaimer, the term of this patent is extended or adjusted under 35 U.S.C. 154(b) by 341 days.

(21) Appl. No.: 17/631,252

(22) PCT Filed: Aug. 27, 2020

(86) PCT No.: PCT/EP2020/074019
§ 371 (c)(1),
(2) Date: Jan. 28, 2022

(87) PCT Pub. No.: WO2021/038007
PCT Pub. Date: Mar. 4, 2021

(65) Prior Publication Data
US 2022/0283226 A1 Sep. 8, 2022

(30) Foreign Application Priority Data
Aug. 29, 2019 (CN) .......................... 201910806648.0

(51) Int. Cl.
*G01R 31/367* (2019.01)
*H01M 10/44* (2006.01)
(Continued)

(52) U.S. Cl.
CPC ........ *G01R 31/367* (2019.01); *H01M 10/443* (2013.01); *H01M 10/48* (2013.01);
(Continued)

(58) Field of Classification Search
CPC . G01R 31/367; G01R 31/389; H01M 10/443; H01M 10/48; H01M 10/486;
(Continued)

(56) References Cited

U.S. PATENT DOCUMENTS 9,519,029 B2 * 12/2016 Trnka ................... G01R 31/389
9,985,466 B2 5/2018 Lee et al.
(Continued)

FOREIGN PATENT DOCUMENTS

CN 107576915 A 1/2018
CN 107666026 A * 2/2018
(Continued)

OTHER PUBLICATIONS

Geifes et al, "Determination of the entropic heat coefficient in a simple electro-thermal lithium-ion cell model with pulse relaxation measurements and least squares algorithm" (Year: 2019).*
(Continued)

*Primary Examiner* — Eyob Hagos
(74) *Attorney, Agent, or Firm* — SHELL USA, INC.

(57) ABSTRACT

The present application relates to a method for estimating the temperature rise rate of a battery under pulsed heating. An equivalent circuit model of the battery is established to obtain the effective entropy potential of the battery and the relationship between the open circuit voltage and the pulsed heating current of the battery. A heat generation model is established according to the effective entropy potential and the relationship between the open circuit voltage and the pulsed heating current. Using the heat generation model and the heat transfer power, an energy formulation in the process of pulsed heating is obtained, to obtain the temperature rise rate of the battery under pulsed heating. The models are used to obtain the relationship between the temperature rise rate under pulsed heating and the pulsed heating current, pro- (Continued)

Establishing an equivalent circuit model of the battery, providing battery reference data and identifying parameters in the equivalent circuit model of the battery to determine effective entropy potential and the relationship between the open circuit voltage and the pulsed heating current ⟶ S10

Establishing a heat generation model of the battery according to the effective entropy potential and the relationship between the open circuit voltage and the pulsed heating current ⟶ S20

Providing a heat transfer power model of the battery, and obtaining an energy formulation of the battery from the heat generation model of the battery and the heat transfer power model of the battery ⟶ S30

Obtaining the temperature rise rate of the battery under pulsed heating according to the energy formulation of the battery ⟶ S40 viding a convenient and comprehensive estimation method for determining the heating effect of pulsed heating in practical applications.

20 Claims, 2 Drawing Sheets

(51) Int. Cl.

| | | |
|---|---|---|
| *H01M 10/48* | (2006.01) | |
| *H01M 10/615* | (2014.01) | |
| *H01M 10/633* | (2014.01) | |
| *H01M 10/637* | (2014.01) | |
| *H02J 7/82* | (2026.01) | |

(52) U.S. Cl.
CPC ....... *H01M 10/486* (2013.01); *H01M 10/615* (2015.04); *H01M 10/633* (2015.04); *H01M 10/637* (2015.04); *H02J 7/82* (2026.01)

(58) Field of Classification Search
CPC ............. H01M 10/615; H01M 10/633; H01M 10/637; H01M 2220/20; H01M 10/625; H01M 10/635; H02J 7/0048
See application file for complete search history.

(56) References Cited

U.S. PATENT DOCUMENTS

| | | | |
|---|---|---|---|
| 10,191,117 B2 * | 1/2019 | Imaizumi ............. | G01R 31/382 |
| 2016/0124052 A1 | 5/2016 | Inguva et al. | |
| 2018/0292465 A1 | 10/2018 | Osara et al. | |

FOREIGN PATENT DOCUMENTS

| | | | |
|---|---|---|---|
| CN | 108062086 A | | 5/2018 |
| JP | 2003157912 A | | 5/2003 |
| JP | 2008298786 A | | 12/2008 |
| JP | 2018009939 A | * | 1/2018 |
| JP | 2018147680 A | | 9/2018 |

OTHER PUBLICATIONS

Stocker et al. "Development and Verification of a Distributed Electro-Thermal Li-Ion Cell Model" (Year: 2018).*
Bandhauer et al. "A Critical Review of Thermal Issues in Lithium-Ion Batteries" Jan. 2011 (pp. R1-R20) (Year: 2011).*
Xia et al. "A Cubature Particle Filter Algorithm to Estimate the State of the Charge of Lithium-Ion Batteries Based on a Second-Order Equivalent Circuit Model" Apr. 2017 (Year: 2017).*
International Search Report and Written Opinion received for PCT Patent Application No. PCT/EP2020/074019, mailed on Dec. 2, 2020, 10 pages.
Geifes et al., "Determination of the Entropic Heat Coefficient in a Simple Electro-thermal Lithium-ion Cell Model With Pulse Relaxation Measurements and Least Squares Algorithm", Journal of Power Sources, vol. 419, Mar. 1, 2019, pp. 148-154, XP085629250.
Stocker et al., "Development and Verification of a Distributed Electro-thermal Li-Ion Cell Model", IECON 2018—44th Annual Conference of the IEEE Industrial Electronics Society, Oct. 21, 2018, pp. 2044-2049, XP033486194.
Office Action Received for Japanese Application No. 2022-513251 Mailed on Aug. 5, 2024, 06 Pages(3 Pages of English Translation and 3 Pages of Official Copy).

* cited by examiner

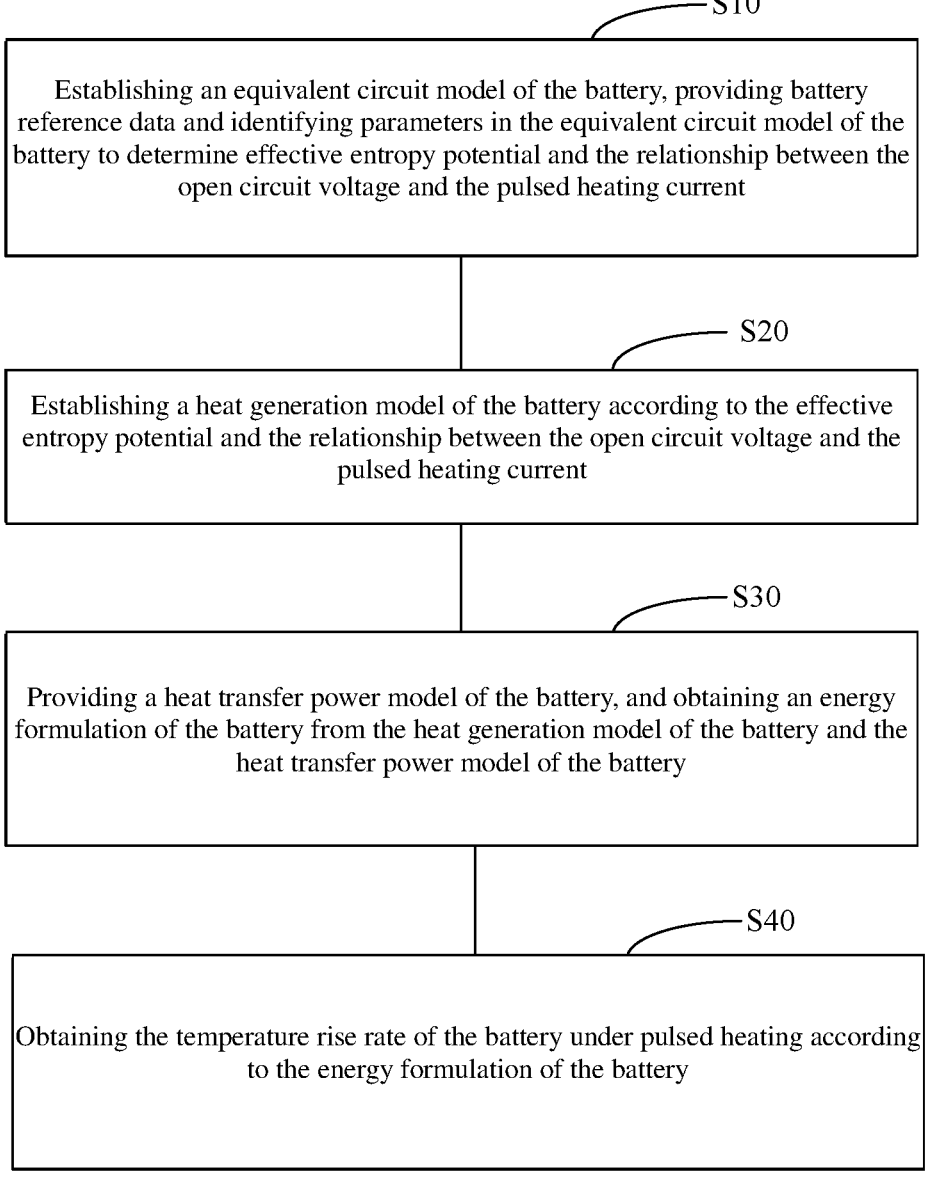

S10

Establishing an equivalent circuit model of the battery, providing battery reference data and identifying parameters in the equivalent circuit model of the battery to determine effective entropy potential and the relationship between the open circuit voltage and the pulsed heating current

S20

Establishing a heat generation model of the battery according to the effective entropy potential and the relationship between the open circuit voltage and the pulsed heating current

S30

Providing a heat transfer power model of the battery, and obtaining an energy formulation of the battery from the heat generation model of the battery and the heat transfer power model of the battery

S40

Obtaining the temperature rise rate of the battery under pulsed heating according to the energy formulation of the battery

FIG. 1

METHOD FOR ESTIMATING THE TEMPERATURE RISE RATE OF A BATTERY UNDER PULSED HEATING

CROSS REFERENCE TO RELATED APPLICATIONS

This is a National stage application of International application No. PCT/EP2020/074019, filed Aug. 27, 2020, which claims priority of CN application No. 201910806648.0, filed 29 Aug. 2019 which is incorporated herein by reference in its entirety.

TECHNICAL FIELD

The present application relates to the technical field of battery management, particularly to a method for estimating the temperature rise rate of a battery under pulsed heating.

BACKGROUND ART

With the wide application of lithium-ion battery vehicles, battery electric vehicles in particular, the performance of the vehicles will closely depend on the performance of lithium-ion batteries. The scene of charging at low temperature is getting more frequent. The problems faced by lithium-ion batteries in a low temperature environment have had a huge impact on their practical applications. The low temperature environment will reduce the available energy of the battery and cause energy loss during discharge, and it will also lead to attenuation of the battery life in the full life cycle. At the same time, the low temperature environment will also increase the impedance of the battery, thereby affecting the life and safety of the battery. These problems have brought great difficulties to the use of the battery in a low temperature environment.

In order to solve the foregoing problems, the battery can be effectively heated by the pulsed heating method before the working cycle of the battery. However, in the process of internal heating of the battery by pulsed heating current, it is necessary to understand the changes of the temperature rise rate of the battery under pulsed heating, so as to estimate the influence of pulsed heating parameters on the temperature rise rate of the battery under pulsed heating.

SUMMARY OF THE INVENTION

To address the issue that in the process of internal heating of the battery by pulsed heating current, it is necessary to understand the changes of the temperature rise rate of the battery under pulsed heating, so as to estimate the influence of pulsed heating parameters on the temperature rise rate of the battery under pulsed heating, a method for estimating the temperature rise rate of a battery under pulsed heating is provided.

A method for estimating the temperature rise rate of a battery under pulsed heating, comprising:

S10, establishing an equivalent circuit model of the battery, providing battery reference data and identifying parameters in the equivalent circuit model of the battery to determine effective entropy potential and the relationship between the open circuit voltage and the pulsed heating current;

S20, establishing a heat generation model of the battery according to the effective entropy potential and the relationship between the open circuit voltage and the pulsed heating current;

S30, providing a heat transfer power model of the battery, and obtaining an energy formulation of the battery from the heat generation model of the battery and the heat transfer power model of the battery; and S40, obtaining the temperature rise rate of the battery under pulsed heating according to the energy formulation of the battery.

In one of the embodiments, parameters in the equivalent circuit model of the battery include open circuit voltage $U_{ocv}$, ohmic internal resistance $R_{ohm}$, first polarization internal resistance $R_c$, second polarization internal resistance $R_d$, first capacitance $C_c$ and second capacitance $C_d$;

The step of establishing an equivalent circuit model of the battery comprises:

Connecting the first polarization internal resistance $R_c$ and the first capacitance $C_c$ in parallel to form a first circuit;

Connecting the second polarization internal resistance $R_d$ and the second capacitance $C_d$ in parallel to form a second circuit; and Connecting the first circuit, the second circuit and the ohmic internal resistance $R_{ohm}$ in series, and then connecting one end to open circuit voltage $U_{ocv}$ of the battery in series and the other end to terminal voltage $U_t$ in series to form the equivalent circuit model of the battery;

The relation between the open circuit voltage and the pulsed heating current is:

$$U_t = U_{ocv} - U_C - U_d - IR_{ohm}$$

Where $U_C$ is the voltage at the two ends of the first polarization internal resistance, $U_d$ is the voltage at the two ends of the second polarization internal resistance, and I is pulsed heating current.

In one of the embodiments, the heat generation model of the battery is:

$$Q = -IT_{abs}\frac{\partial U_{OCV}}{\partial T} + I(U_{OCV} - U_t)$$

Where $$T_{abs}\frac{\partial U_{ocv}}{\partial T}$$

potential.

In one of the embodiments, the energy formulation of the battery is:

$$mc\frac{dT}{dt} = -Q_n + Q$$

Where m is the weight of the battery, c is the specific heat capacity of the battery, and $Q_n$ is the heat transfer power.

In one of the embodiments, when heat conduction and thermal radiation are ignored, the heat transfer power model of the battery is:

$$Q_n = hS(T_{bat} - T_{amb})$$

Where h is a convection heat transfer coefficient, S is the surface area of the battery, $T_{bat}$ is battery temperature, and $T_{amb}$ is environmental temperature.

In one of the embodiments, the relation of the temperature rise rate of the battery under pulsed heating is:

$$\frac{dT}{dt} = \frac{1}{mc}\left[-IT_{abs}\frac{\partial U_{OCV}}{\partial T} + I(U_{OCV} - U_t)\right] - \frac{hS}{mc}(T_{bat} - T_{amb}).$$

In one of the embodiments, parameters in the equivalent circuit model of the battery are identified using one of the least square algorithm, genetic algorithm and neural network algorithm.

In one of the embodiments, the step of providing battery reference data comprises:

S110, providing a battery to be tested, discharging the battery till the cut-off voltage, putting the battery in a temperature chamber and adjusting the temperature of the temperature chamber to a first temperature value;

S120, charging the battery to be tested with a first amplitude value in constant-current mode until the preset charging capacity is achieved;

S130, adjusting the temperature of the temperature chamber to a second temperature value;

S140, discharging the battery to be tested with a second amplitude value in constant-current mode for a first time value, and then pausing for a second time value;

S150, charging the battery to be tested with a third amplitude value in constant-current mode for the second time value, and adjusting the temperature of the temperature chamber to the first temperature value; and S160, repeating steps S120 to S150 for the preset times.

A computer device, comprising a memory, a processor, and a computer program stored on the memory and capable of running on the processor, wherein when the processor executes the computer program, the steps of the method for estimating the temperature rise rate of a battery under pulsed heating in any of the foregoing embodiments are achieved.

A computer-readable storage medium, on which a computer program is stored, wherein when the computer program is executed by the processor, the steps of the method for estimating the temperature rise rate of a battery under pulsed heating in any of the foregoing embodiments are achieved.

The foregoing method for estimating the temperature rise rate of battery of a battery under pulsed heating identifies the parameters in the equivalent circuit model of the battery by establishing the equivalent circuit model of the battery, to obtain the effective entropy potential of the battery and the relationship between the open circuit voltage and the pulsed heating current of the battery. The amplitude and period of the pulsed heating current are pulsed parameters. Then according to the effective entropy potential and the relationship between the open circuit voltage and the pulsed heating current of the battery, a heat generation model is established. By using the heat generation model and the heat transfer power of the battery, an energy formulation of the battery in the process of pulsed heating is obtained, so as to obtain the temperature rise rate of the battery under pulsed heating. By establishing an equivalent circuit model of the battery and using the heat generation model of the battery and the heat transfer power model of the battery, the foregoing method can obtain the relationship between the temperature rise rate of the battery under pulsed heating and the pulsed heating current, providing a convenient and comprehensive estimation method for determining the heating effect of pulsed heating in practical applications.

BRIEF DESCRIPTION OF THE DRAWINGS

FIG. 1 is a flow diagram of a method for estimating the temperature rise rate of a battery under pulsed heating provided by an embodiment of the present application;

DETAILED DESCRIPTION

Figure 2:
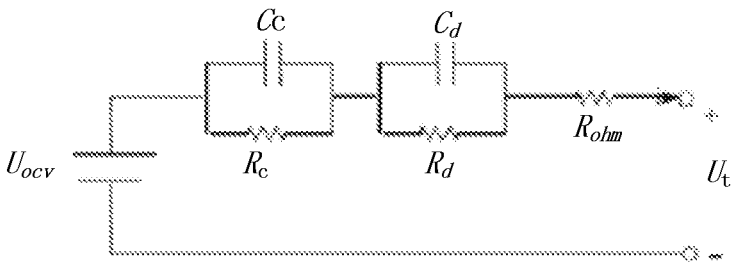
FIG. 2 is a structural view of a second-order RC model provided by an embodiment of the present application.

In order to make the foregoing objectives, features and advantages of the present application more evident and easier to understand, specific implementation manners of the present application are described in detail by referring to the accompanying drawings below. In the following description, many details are provided to fully understand the present application. However, the present application can be implemented in many ways that are different from this description, and those skilled in the art can make similar modifications without departing from the spirit of the present application, so the present application is not limited to the specific implementation disclosed below.

It should be noted that when an element is said to be "arranged on" another element, it can be directly on another element or there can be a middle element. When an element is considered to be "connected" to another element, it can be directly connected to another element or there can be a middle element at the same time.

Unless otherwise defined, all technical and scientific terms used herein have the same meanings as commonly understood by those skilled in the technical field to which the present application pertains. The terms used in the specification of the present application herein are intended to describe specific embodiments only and not to limit the present application. The term "and/or" used herein includes any of one or more related listed items and all combinations thereof.

Please refer to FIG. 1. The present application provides a method for estimating the temperature rise rate of a battery under pulsed heating. The method comprises:

S10, establishing an equivalent circuit model of the battery, providing battery reference data and identifying parameters in the equivalent circuit model of the battery to determine effective entropy potential and the relationship between the open circuit voltage and the pulsed heating current. Through the equivalent circuit model of the battery, the voltage response of the battery under the action of pulse current is analyzed to estimate the accuracy of the model in simulating a pulse process. In an optional embodiment, parameters in the equivalent circuit model of the battery are identified using one of the least square algorithm, genetic algorithm and neural network algorithm. The effective entropy potential determines the amount of reaction heat of the battery during charging and discharging, and is an important factor influencing heat generation of the battery.

S20, establishing a heat generation model of the battery according to the effective entropy potential and the relationship between the open circuit voltage and the pulsed heating current. The heat generation of the battery is mainly composed of two parts, one is the Joule heat of the battery, and the other is the reaction heat of the battery. In addition, there is also heat generated during the mixing process caused by the concentration difference of the internal substances of the battery, and the side reaction heat caused by various side reactions. In general, the values of the mixing heat and the side reaction heat are small and can be ignored. The effective entropy potential determines the reaction heat of the battery, and the relationship between the open circuit voltage and the pulsed heating current determines the Joule heat of the battery. Therefore, according to the effective entropy potential, and the relationship between the open circuit voltage and the pulsed heating current, a heat generation model of the battery can be established. The heat generation model of the battery can be a Bernardi heat generation model.

S30, providing a heat transfer power model of the battery, and obtaining an energy formulation of the battery from the heat generation model of the battery and the heat transfer power model of the battery. The heat transfer of the battery mainly includes three ways, namely: heat conduction, thermal radiation and convection heat transfer. Heat conduction mainly occurs in a process of heat transfer from the inside of the battery to the outside of the battery. Thermal radiation refers to a process of energy transfer in the form of electromagnetic waves from the surface of the battery to the outside world. Convection heat transfer mainly occurs in a process of heat transfer between the battery and the air.

S40, obtaining the temperature rise rate of the battery under pulsed heating according to the energy formulation of the battery. The temperature rise rate of the battery under pulsed heating can be solved from the energy formulation of the battery and the quotient between the mass of the battery and the specific heat capacity of the battery.

In this embodiment, the foregoing method for estimating the temperature rise rate of a battery under pulsed heating identifies the parameters in the equivalent circuit model of the battery by establishing the equivalent circuit model of the battery, to obtain the effective entropy potential of the battery and the relationship between the open circuit voltage and the pulsed heating current of the battery. The amplitude and period of the pulsed heating current are pulsed parameters. Then according to the effective entropy potential and the relationship between the open circuit voltage and the pulsed heating current of the battery, a heat generation model is established. By using the heat generation model and the heat transfer power of the battery, an energy formulation of the battery in the process of pulsed heating is obtained, so as to obtain the temperature rise rate of the battery under pulsed heating. By establishing an equivalent circuit model of the battery and using the heat generation model of the battery and the heat transfer power model of the battery, the foregoing method can obtain the relationship between the temperature rise rate of the battery under pulsed heating and the pulsed heating current, providing a convenient and comprehensive estimation method for determining the heating effect of pulsed heating in practical applications.

Please refer to FIG. 2. In one of the embodiments, parameters in the equivalent circuit model of the battery include open circuit voltage $U_{ocv}$, ohmic internal resistance $R_{ohm}$, first polarization internal resistance $R_c$, second polarization internal resistance $R_d$, first capacitance $C_c$ and second capacitance $C_d$. The step of establishing the equivalent circuit model of the battery can be connecting the first polarization internal resistance $R_c$ and the first capacitance $C_c$ in parallel to form a first circuit, connecting the second polarization internal resistance $R_d$ and the second capacitance $C_d$ in parallel to form a second circuit, connecting the first circuit, the second circuit and the ohmic internal resistance $R_{ohm}$ in series, and then connecting one end to open circuit voltage $V_{ocv}$ of the battery in series and the other end to terminal voltage $U_t$ in series to form the equivalent circuit model of the battery. The relation between the open circuit voltage and the pulsed heating current is:

$$U_t = U_{ocv} - U_C - U_d - IR_{ohm} \qquad \text{Formula (1)}$$

Where $U_C$ is the voltage at the two ends of the first polarization internal resistance, $U_d$ is the voltage at the two ends of the second polarization internal resistance, and I is pulsed heating current.

The foregoing six types of parameters in the equivalent circuit model of the battery (open circuit voltage $V_{ocv}$, ohmic internal resistance $R_{ohm}$, first polarization internal resistance $R_c$, second polarization internal resistance $R_d$, first capacitance $C_c$ and second capacitance $C_d$) jointly determine the voltage response of the battery under the action of a pulse current. Parameter identification methods include identification based on the least square algorithm, and identification based on genetic algorithm. During parameter identification, battery reference data needs to be provided.

In an optional embodiment, the step of providing battery reference data comprises:

S110, providing a battery to be tested, discharging the battery till the cut-off voltage, putting the battery in a temperature chamber and adjusting the temperature of the temperature chamber to a first temperature value.

S120, charging the battery to be tested with a first amplitude value in constant-current mode until the preset charging capacity is achieved.

S130, adjusting the temperature of the temperature chamber to a second temperature value.

S140, discharging the battery to be tested with a second amplitude value in constant-current mode for a first time value, and then pausing for a second time value.

S150, charging the battery to be tested with a third amplitude value in constant-current mode for the second time value, and adjusting the temperature of the temperature chamber to the first temperature value.

S160, repeating steps S120 to S150 for the preset times.

Specifically, to obtain mixed test data of −20° C. to 25° C., the following operations can be performed: discharge the battery to be tested till the cut-off voltage, put the battery in a temperature chamber, adjust temperature to 25° C. and let it stand sufficiently; charge the battery in ⅓ constant-current mode to achieve 10% SOC charging capacity, and let it stand sufficiently; adjusting temperature to −20° C. and let it stand sufficiently; do mixed pulse experiment at low temperature: discharge at 0.2 C for 30 s, pause for 30 s, and charge at 0.2 C for 30 s; adjust temperature to 25° C. and let it stand sufficiently; do mixed pulse experiment at normal temperature: discharge at 1.5 C for 30 s, pause for 30 s, and charge at 1.5 C for 30 s. From the mixed test data, the internal resistance of the battery, the change of the open circuit voltage of the battery with temperature and the effective entropy potential can be obtained, providing data support for the parameter identification process.

In an optional embodiment, parameters can be identified by genetic algorithm, in which the identification processes of ohmic internal resistance, polarization internal resistance and capacitance are decoupled. Ohmic internal resistance is identified from the extreme processes before and after pulse current evacuation and action. The genetic algorithm randomly generates initial individuals, screens the individuals through constraints and fitness functions, selects a certain mutation probability, and evolves from generation to generation. Here, the size of population determines the number of individuals in each generation, and the greater the number of individuals is, the greater the probability of producing better individuals will be. The greater the number of genetic generations is, the greater the probability of screening out excellent individuals from generation to generation will be. In an optional embodiment, the size of population can be set at 200, the number of generations is set at 1,000, and the tolerance is set at 10-12. The equivalent circuit model of the battery can be a second-order RC model and the transient voltage at the two ends of the polarization resistance is:

$$U_c(t + \Delta t) = e^{\frac{-\Delta t}{\tau_c}} U_c(t) + R_c\left(1 - e^{\frac{-\Delta t}{\tau_c}}\right)I(t) \quad \text{Formula (2)}$$

$$U_d(t + \Delta t) = e^{\frac{-\Delta t}{\tau_d}} U_d(t) + R_d\left(1 - e^{\frac{-\Delta t}{\tau_d}}\right)I(t) \quad \text{Formula (3)}$$

Where $\Delta t$ is simulation step size, and $\tau_c$ and $\tau_d$ are time constants, of which:

$$\tau_c = R_c C_c, \tau_d = R_d C_d \quad \text{Formula (4)}$$

Then the terminal voltage of the battery can be expressed as:

$$U_{testimated}(t+\Delta t) = U_{ocv}(t+\Delta t) + U_c(t+\Delta t) + U_d(t+\Delta t) + R_{ohm}I(t+\Delta t) \quad \text{Formula (5)}$$

From the foregoing relationship, the foregoing voltage value can be calculated based on the experimentally measured current data I (t), so as to obtain estimated voltage $U_{testimated}$ based on the second-order $R_C$ model. The fitness function of the genetic algorithm is the root mean square value of the difference between the estimated voltage and the actually measured voltage in the time domain, and its theoretical expression is:

$$U_{RMS} = \sqrt[2]{\frac{\int [U_{texperiment}(t) - U_{testimated}(t)]^2 dt}{T}} \quad \text{Formula (6)}$$

Where T is total time and $U_{texperiment}$ is experimental voltage. In the identification process, the estimated voltage uses the experimentally measured current data with a certain sampling interval as calculation input, so the calculation process is the foregoing discrete iteration process based on the simulation step size. Therefore, the expression of the root mean square value eventually selected by the fitness function of the genetic algorithm is:

$$U_{RMS} = \sqrt[2]{\frac{\sum_{i=1}^{n}[U_{texperiment}(t_i) - U_{testimated}(t_i)]^2}{T}}, \quad \text{Formula (7)}$$

$$T = \sum_{i=1}^{n} t_i \quad \text{55}$$

Parameter identification is performed on the foregoing basis to get the corresponding circuit model parameters.

In one of the embodiments, the heat generation model of the battery is:

$$Q = -IT_{abs}\frac{\partial U_{OCV}}{\partial T} + I(U_{OCV} - U_t) \quad \text{Formula (8)}$$

Where $$T_{abs}\frac{\partial U_{ocv}}{\partial T}$$

is the effective entropy potential; I is pulsed heating current, positive during discharging, negative during charging; the first term on the right of the equation is reaction heat, which is determined by the effective entropy potential of the battery and is electrochemical reversible heat; the second term on the right of the equation is Joule heat caused by the total internal resistance of the battery, including heat generated by ohmic internal resistance and heat generated by polarization internal resistance.

In an embodiment, the energy formulation of the battery is:

$$mc\frac{dT}{dt} = -Q_n + Q \quad \text{Formula (9)}$$

Where m is the weight of the battery, c is the specific heat capacity of the battery, and $Q_n$ is the heat transfer power. The heat transfer of the battery mainly includes three ways, namely: heat conduction, thermal radiation and convection heat transfer. Heat conduction mainly occurs in a process of heat transfer from the inside of the battery to the outside of the battery. Thermal radiation refers to a process of energy transfer in the form of electromagnetic waves from the surface of the battery to the outside world. Convection heat transfer mainly occurs in a process of heat transfer between the battery and the air. In an optional embodiment, in the experimental environment, the heat transfer between the battery and the outside world is mainly convection heat transfer, so the value of heat conduction and thermal radiation is small. Therefore, in an embodiment of the present application, when heat conduction and thermal radiation are ignored, the heat transfer power model of the battery is:

$$Q_n = hS(T_{bat} - T_{amb}) \quad \text{Formula (10)}$$

Where h is a convection heat transfer coefficient, S is the surface area of the battery, $T_{bat}$ is battery temperature, and $T_{amb}$ is environmental temperature. The formula for the heat transfer power model of the battery and the heat generation model of the battery are substituted into the energy formulation of the battery to obtain:

$$mc\frac{dT}{dt} = -IT_{abs}\frac{\partial U_{OCV}}{\partial T} + I(U_{OCV} - U_t) - hS(T_{bat} - T_{amb}) \quad \text{Formula (11)}$$

Then, the relation of the temperature rise rate of the battery under pulsed heating is:

$$\frac{dT}{dt} = \frac{1}{mc}\left[-IT_{abs}\frac{\partial U_{OCV}}{\partial T} + I(U_{OCV} - U_t)\right] - \frac{hS}{mc}(T_{bat} - T_{amb}) \quad \text{Formula (12)}$$

Here, the convection heat transfer coefficient can be obtained by fitting the heat dissipation experiment results of the battery. For example, the experiment process of the battery pulsed heating experiment can be selected as an example under the condition that the environment of the temperature chamber is −10° C. For the second half of the experiment, that is, after the pulse is withdrawn, the heat dissipation process of the battery is analyzed. From the relationship between temperature and time during the experiment, the convection heat transfer coefficient can be obtained through fitting.

A computer device, comprising a memory, a processor, and a computer program stored on the memory and capable of running on the processor, wherein when the processor executes the computer program, the steps of the method for estimating the temperature rise rate of a battery under pulsed heating in any of the foregoing embodiments are achieved.

A computer-readable storage medium, on which a computer program is stored, wherein when the computer program is executed by the processor, the steps of the method for estimating the temperature rise rate of a battery under pulsed heating in any of the foregoing embodiments are achieved.

The technical features of the foregoing embodiments can be freely combined. In order to make the description concise, all possible combinations of the technical features in the foregoing embodiments are not described. However, as long as there is no contradiction in the combinations of these technical features, they should be considered as falling within the scope of this specification.

The foregoing embodiments only represent a few implementation manners of the present application. Their descriptions are concrete and detailed, but they shall not be therefore understood as limitations to the scope of the patent under application. It should be noted that for those of ordinary skill in the art, various changes and modifications may be made to the embodiments without departing from the concept of the present application. All these fall within the scope of protection of the present application. Therefore, the scope of protection of the patent under the present application shall be subject to the appended claims.

The invention claimed is:

1. A method for estimating a temperature rise rate of a battery under pulsed heating, comprising:

establishing an equivalent circuit model of the battery by connecting a first polarization resistance Rc and a first capacitance Cc in parallel to form a first circuit, connecting a second polarization resistance Rd and a second capacitance Cd in parallel to form a second circuit and connecting the first circuit to the second circuit in series;

identifying parameters in the equivalent circuit model, using a predictive algorithm and battery reference data, to determine effective entropy potential and a relationship between an open circuit voltage and a pulsed heating current;

establishing a heat generation model of the battery according to the effective entropy potential and the relationship between the open circuit voltage and the pulsed heating current;

providing a heat transfer power model of the battery, and obtaining an energy formulation of the battery from the heat generation model of the battery and the heat transfer power model of the battery; and obtaining the temperature rise rate of the battery under pulsed heating according to the energy formulation of the battery, wherein the step of providing battery reference data comprises the following steps:

step a) providing the battery to be tested, discharging the battery until the cut-off voltage, putting the battery in a temperature chamber and adjusting the temperature of the temperature chamber to a first temperature value, step b) charging the battery to be tested with a first amplitude value of $\frac{1}{3}$ C in constant-current mode at a normal temperature until 10% SOC charging capacity is achieved, step c) adjusting the temperature of the temperature chamber from the normal temperature to a low temperature, step d-i) discharging the battery to be tested with a second amplitude value of 0.2 C in constant-current mode for 30 seconds, and then pausing for 30 seconds, step d-ii) charging the battery to be tested with a third amplitude value of 0.2 C in constant-current mode for the second time value, and step e) adjusting the temperature of the temperature chamber back to the normal temperature and performing a mixed pulse experiment at the normal temperature, wherein the mixed pulse experiment includes discharging at 1.5 C for 30 seconds and pausing for 30 seconds and charging at 1.5 C for 30 seconds, and repeating steps b through e to obtain mixed test data at the normal temperature and the low temperature for parameter identification.

2. The method according to claim 1, wherein parameters in the equivalent circuit model include an open circuit voltage Uocv, an ohmic internal resistance Rohm, the first polarization resistance Rc, the second polarization resistance Rd, the first capacitance Cc and the second capacitance Cd, and wherein establishing the equivalent circuit model of the battery further includes:

connecting the first polarization resistance Rc and the first capacitance Cc in parallel to form the first circuit;

connecting the second polarization resistance Rd and the second capacitance Cd in parallel to form the second circuit; and connecting the first circuit, the second circuit and the ohmic internal resistance Rohm in series, and then connecting one end to the open circuit voltage Uocv of the battery in series and another end to a terminal voltage Ut in series to form the equivalent circuit model; and wherein the relation between the open circuit voltage and the pulsed heating current is:

$$U_t = U_{ocv} - U_C - U_d - IR_{ohm}$$

where $U_C$ is the voltage at ends of the first polarization resistance, $U_d$ is the voltage at ends of the second polarization resistance, and I is the pulsed heating current.

3. The method according to claim 2, wherein the heat generation model of the battery is:

$$Q = -IT_{abs}\frac{\partial U_{OCV}}{\partial T} + I(U_{OCV} - U_t)$$

where $$T_{abs}\frac{\partial U_{ocv}}{\partial T}$$

is the effective entropy potential.

4. The method according to claim 3, wherein the energy formulation of the battery is:

$$\mathrm{mc}\frac{dT}{dt} = -Q_n + Q$$

where m is the weight of the battery, c is the specific heat capacity of the battery, and $Q_n$ is the heat transfer power.

5. The method according to claim 4, wherein when heat conduction and thermal radiation are ignored, the heat transfer power model of the battery is:

$$Q_n = hS(T_{bat} - T_{amb})$$

where h is a convection heat transfer coefficient, S is the surface area of the battery, $T_{bat}$ is battery temperature, and $T_{amb}$ is environmental temperature.

6. The method according to claim 5, wherein the relation of the temperature rise rate of the battery under pulsed heating is:

$$\frac{dT}{dt} = \frac{1}{mc}\left[-IT_{abs}\frac{\partial U_{OCV}}{\partial T} + I(U_{OCV} - U_t)\right] - \frac{hS}{mc}(T_{bat} - T_{amb}).$$

7. The method according to claim 1, wherein the predictive algorithm is one of a least square algorithm, a genetic algorithm and a neural network algorithm.

8. The method of claim 1, wherein the normal temperature is 25° C., and the low temperature is −20° C.

9. A computer device, comprising a memory, a processor, and a computer program stored on the memory and capable of running on the processor, wherein when the processor executes the computer program, the steps of the method for estimating the temperature rise rate of a battery under pulsed heating according to claim 1 are achieved.

10. A non-transitory computer-readable storage medium, on which a computer program is stored, wherein when the computer program is executed by a processor, the steps of the method for estimating the temperature rise rate of a battery under pulsed heating according to claim 1 are achieved.

11. A computer device, comprising a memory, a processor, and a computer program stored on the memory and capable of running on the processor, wherein when the processor executes the computer program, the steps of the method for estimating the temperature rise rate of a battery under pulsed heating according to claim 2 are achieved.

12. A computer device, comprising a memory, a processor, and a computer program stored on the memory and capable of running on the processor, wherein when the processor executes the computer program, the steps of the method for estimating the temperature rise rate of a battery under pulsed heating according to claim 3 are achieved.

13. A computer device, comprising a memory, a processor, and a computer program stored on the memory and capable of running on the processor, wherein when the processor executes the computer program, the steps of the method for estimating the temperature rise rate of a battery under pulsed heating according to claim 4 are achieved.

14. A computer device, comprising a memory, a processor, and a computer program stored on the memory and capable of running on the processor, wherein when the processor executes the computer program, the steps of the method for estimating the temperature rise rate of a battery under pulsed heating according to claim 5 are achieved.

15. A computer device, comprising a memory, a processor, and a computer program stored on the memory and capable of running on the processor, wherein when the processor executes the computer program, the steps of the method for estimating the temperature rise rate of a battery under pulsed heating according to claim 6 are achieved.

16. A computer device, comprising a memory, a processor, and a computer program stored on the memory and capable of running on the processor, wherein when the processor executes the computer program, the steps of the method for estimating the temperature rise rate of a battery under pulsed heating according to claim 7 are achieved.

17. A computer device, comprising a memory, a processor, and a computer program stored on the memory and capable of running on the processor, wherein when the processor executes the computer program, the steps of the method for estimating the temperature rise rate of a battery under pulsed heating according to claim 1 are achieved.

18. A non-transitory computer-readable storage medium, on which a computer program is stored, wherein when the computer program is executed by a processor, the steps of the method for estimating the temperature rise rate of a battery under pulsed heating according to claim 2 are achieved.

19. A non-transitory computer-readable storage medium, on which a computer program is stored, wherein when the computer program is executed by a processor, the steps of the method for estimating the temperature rise rate of a battery under pulsed heating according to claim 3 are achieved.

20. A non-transitory computer-readable storage medium, on which a computer program is stored, wherein when the computer program is executed by the processor, the steps of the method for estimating the temperature rise rate of a battery under pulsed heating according to claim 4 are achieved.

* * * * *